United States Patent
Chien et al.

[11] Patent Number: 6,037,220
[45] Date of Patent: Mar. 14, 2000

[54] METHOD OF INCREASING THE SURFACE AREA OF A DRAM CAPACITOR STRUCTURE VIA THE USE OF HEMISPHERICAL GRAINED POLYSILICON

[75] Inventors: Ho-Ching Chien, Hsinchu; Kao-Hsing Wang, Kaohsung, both of Taiwan

[73] Assignee: Vanguard International Semiconductor Corporation, Hsin-Chu, Taiwan

[21] Appl. No.: 09/121,693

[22] Filed: Jul. 24, 1998

[51] Int. Cl.[7] .................................................. H01L 21/8242
[52] U.S. Cl. ............................................. 438/255; 438/398
[58] Field of Search .................................. 438/253–256, 438/396–398, 964

[56] References Cited

U.S. PATENT DOCUMENTS

| | | | |
|---|---|---|---|
| 5,256,587 | 10/1993 | Jun et al. .................................. | 437/52 |
| 5,340,763 | 8/1994 | Dennison ................................. | 437/52 |
| 5,444,653 | 8/1995 | Nagasawa et al. ...................... | 365/149 |
| 5,447,878 | 9/1995 | Park et al. ................................ | 437/52 |
| 5,663,085 | 9/1997 | Tanigawa ................................. | 438/255 |
| 5,930,625 | 7/1999 | Lin et al. ................................. | 438/253 |

*Primary Examiner*—Jey Tsai
*Attorney, Agent, or Firm*—George O. Saile; Stephen B. Ackerman

[57] ABSTRACT

A method of creating an STC structure, with increased surface area, needed for high density, DRAM designs, has been developed. The increased surface area, for the STC structure is obtained via use of HSG polysilicon sidewalls, and via use of a grated, top surface topography. A capping insulator layer is used as a hard mask, to allow formation of the HSG polysilicon sidewalls, on the sides of a storage node structure, without degradation to the top surface of the storage node structure, during the HSG polysilicon sidewall formation process. A second iteration features the creation of a storage node structure, with a grated, top surface topography, as well as HSG polysilicon sidewalls. The grated top surface topography, for the storage node structure, is obtained by forming crevices in the top surface of the storage node structure via a series of RIE procedures, using the HSG polysilicon features, and underlying capping insulator layer features, as an etch mask.

21 Claims, 7 Drawing Sheets

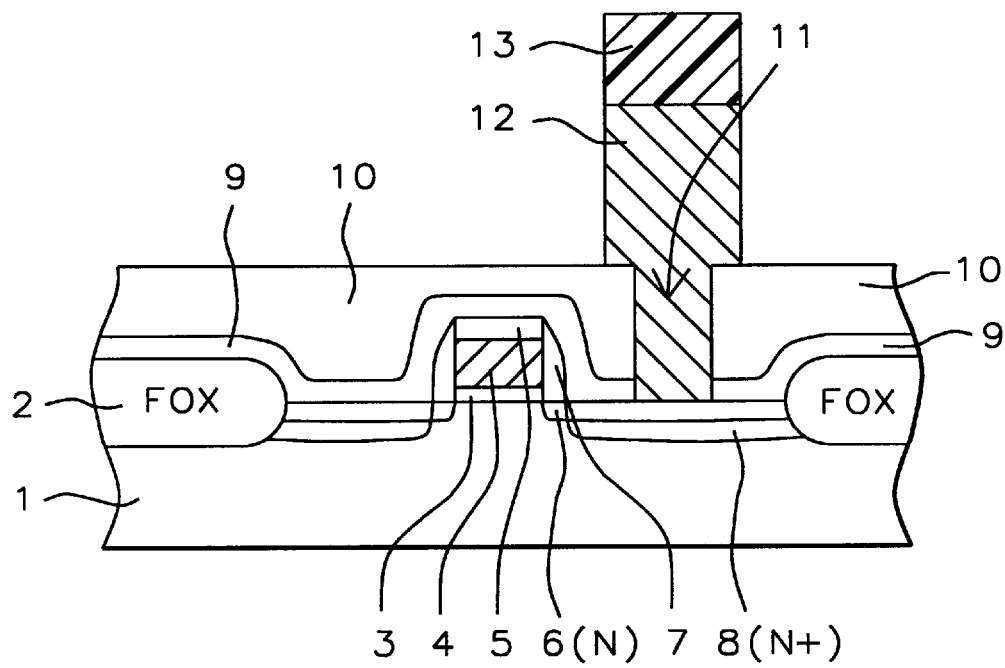
FIG. 3 – Prior Art
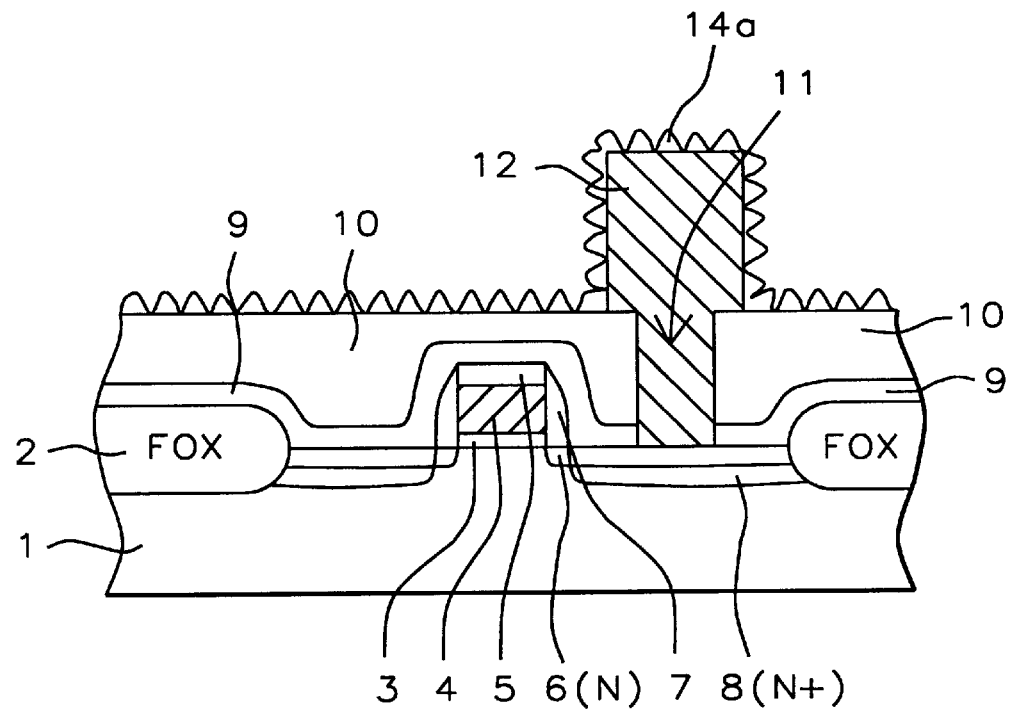
FIG. 4 – Prior Art

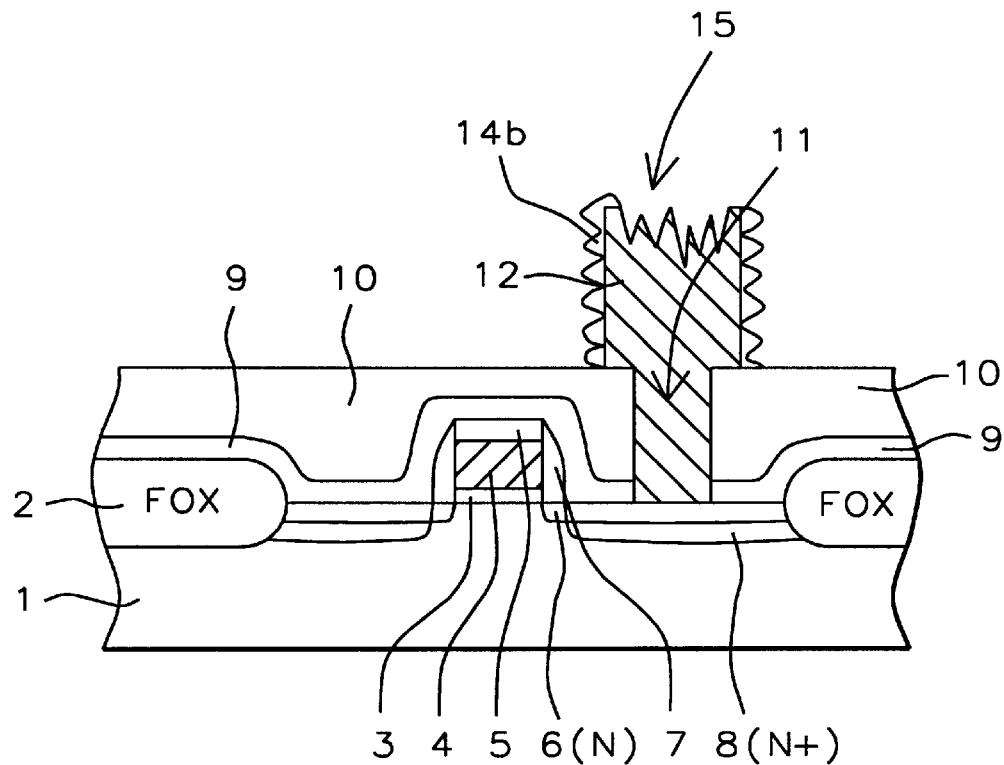
FIG. 5 – Prior Art
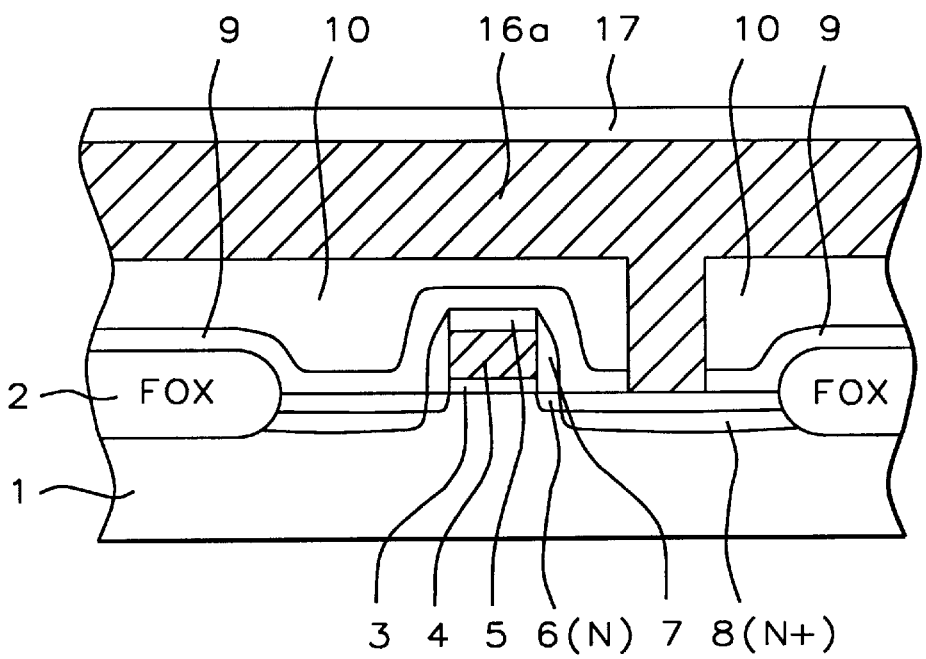
FIG. 6

METHOD OF INCREASING THE SURFACE AREA OF A DRAM CAPACITOR STRUCTURE VIA THE USE OF HEMISPHERICAL GRAINED POLYSILICON

BACKGROUND OF THE INVENTION (1) Field of the Invention

The present invention relates to a method used to fabricate high density, semiconductor, DRAM cells, and more specifically to a process used to increase the surface area, and the accompanying capacitance of a stacked capacitor structure, via the use of hemispherical grain silicon.

(2) Description of the Prior Art

The semiconductor industry is continually striving to improve device performance, while still focusing on methods of reducing manufacturing costs. These objectives have been successfully addressed by the ability of the semiconductor industry to produce chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. HSG polysilicon layers have been used as an overlying layer, on a conventional polysilicon structure, as shown by Dennison, in U.S. Pat. No. 5,340,763, and by Nagasawa, et al, in U.S. Pat. No. 5,444,653. The Dennison invention describes a storage node, or lower electrode, of an STC structure, in which the surface area of a polysilicon lower electrode structure is increased by deposition of an HSG polysilicon layer, on an insulator layer, which is overlying the top surface of the lower electrode structure. Subsequent etching procedures result in the transfer of the roughened surface, created by the HSG polysilicon layer, to only the top surface of the polysilicon lower electrode structure. The roughened, top surface of the polysilicon lower electrode, with the increased surface area, results in a capacitance increase for the subsequent capacitor structure. However the capacitance increase, realized in U.S. Pat. No. 5,340,763, is limited by subjecting only the top surface of the polysilicon lower electrode to the HSG polysilicon deposition and etch procedure, leaving the sides of the polysilicon lower electrode flat.

This invention will describe a process for increasing the surface area of a polysilicon lower electrode, or storage node electrode, by forming an HSG polysilicon layer only on the sides of the storage node electrode, while maintaining a flat, or non-roughened, top surface. This configuration is a result of using a silicon oxide hard mask, overlying the top surface of the lower electrode structure, therefore accepting the HSG polysilicon deposition. The use of the silicon oxide hard mask, prevents the deleterious attack of the polysilicon lower electrode structure, during an HSG polysilicon etch back procedure, performed to remove unwanted HSG polysilicon from non-capacitor regions. This invention will also offer another iteration in which HSG polysilicon-silicon oxide, hard mask features, are prepared on the top surface of a polysilicon lower electrode structure, than used as a mask, to remove polysilicon from the spaces exposed between the HSG polysilicon-silicon oxide features. The etch process results in a roughened, polysilicon lower electrode, top surface, and along with the HSG polysilicon coated sidewalls, offer greater surface area increases than counterparts fabricated with only roughened sides, or with only a roughened top surface.

SUMMARY OF THE INVENTION

It is an object of this invention to create a DRAM device, with an STC structure, in which the surface area of the storage node electrode, of the STC structure is increased, via formation of an HSG polysilicon layer, on the sides of the storage node structure.

It is another object of this invention to increase the surface area of a storage node electrode, of the STC structure, by creating a grated topography in the top surface of a polysilicon storage node electrode, via etching of the top surface of a polysilicon surface node electrode, using a HSG polysilicon-silicon oxide features as a etch mask.

In accordance with the present invention a method for fabricating an STC structure, for a DRAM device, using an HSG polysilicon layer on the sides of polysilicon storage node structure, as well as using a polysilicon storage node structure featuring a grated top surface topography, comprised of narrow recesses, has been developed. Transfer gate transistors comprised of: a thin gate insulator; a polysilicon, or polycide, (metal silicide-polysilicon), gate structure, formed from a first polysilicon, or polycide layer; lightly doped source and drain regions; insulator spacers on the sidewalls of the polysilicon, or polycide gate structure; and heavily doped source and drain regions; are formed on a semiconductor substrate. A composite insulator layer, is next deposited, planarized, and followed by an opening of a storage node contact hole in the composite insulator layer, made to expose the source and drain regions of the transfer gate transistor. A second polysilicon layer is deposited, heavily doped via use of in situ doping procedures, completely filling the storage node contact hole, and contacting the source and drain regions of the transfer gate transistor. The second polysilicon layer also overlies the interlevel insulator layer, in regions outside the storage node contact hole. A silicon oxide layer is deposited on the second polysilicon layer. Patterning of the silicon oxide layer, and underlying second polysilicon layer, result in the creation of the polysilicon storage node structure, capped with the silicon oxide layer. A deposition of an HSG polysilicon layer is next performed, covering the storage node structure, and overlying the composite insulator layer in regions not covered by the storage node structure. A first iteration of this invention is the removal of unwanted regions of HSG polysilicon, via an unmasked, anisotropic etching procedure, creating HSG polysilicon sidewalls, on the sides of the storage node structure. The silicon oxide layer, used to cap, and protect the underlying storage node structure, during the HSG polysilicon sidewall formation, is next removed. The formation of a capacitor dielectric layer, on the storage node structure, and the formation of an upper polysilicon electrode, complete the procedure for creation of the STC structure.

A second iteration of this invention is to create a grated topography, comprised of narrow HSG-silicon oxide features on the top surface of the storage node structure, via an anisotropic etch, selective to etching silicon oxide, and then to use these narrow features as a mask to create narrow recesses in the top surface of the storage node structure, via the anisotropic etch, used to create the HSG polysilicon sidewalls, on the sides of the storage node structure. Removal of silicon oxide, from the top surface of the storage node structure, results in an increased surface area, storage node structure, featuring HSG polysilicon sidewalls, and a grated, top surface topography, comprised of narrow recesses. Formation of a capacitor dielectric layer, and of an upper polysilicon electrode, complete the formation of the STC structure.

BRIEF DESCRIPTION OF THE DRAWINGS

The object and other advantages of this invention are best explained in the preferred embodiment with reference to the attached drawings that include:

FIGS. 1–2, 6–13, which schematically, in crosssectional style, show the key fabrication stages for a first and a second iteration, used for the creation of a STC structure, with increased surface area resulting from a polysilicon storage node electrode structure, with HSG polysilicon sidewalls, and with a polysilicon storage node structure featuring HSG polysilicon sidewalls, and also featuring a grated top surface topography comprised of narrow recesses in polysilicon.

FIGS. 3–5, which schematically, in cross-sectional style, show prior art, and the possible consequences of forming HSG polysilicon sidewalls, on a storage node structure, without the use of the capping silicon oxide layer, used in this invention.

DESCRIPTION OF THE PREFERRED EMBODIMENTS

The method of forming an STC structure, for a DRAM device, with increased surface area and increased capacitance, resulting from the use of a STC structure that features a polysilicon storage node electrode, with HSG polysilicon sidewalls, and with a grated top surface topography, will now be described in detail. The transfer gate transistor, used for this DRAM device,in this invention, will be an N channel device. However the STC structure, with the increased surface area described in this invention, can also be applied to P channel, transfer gate transistor.

Figure 1:
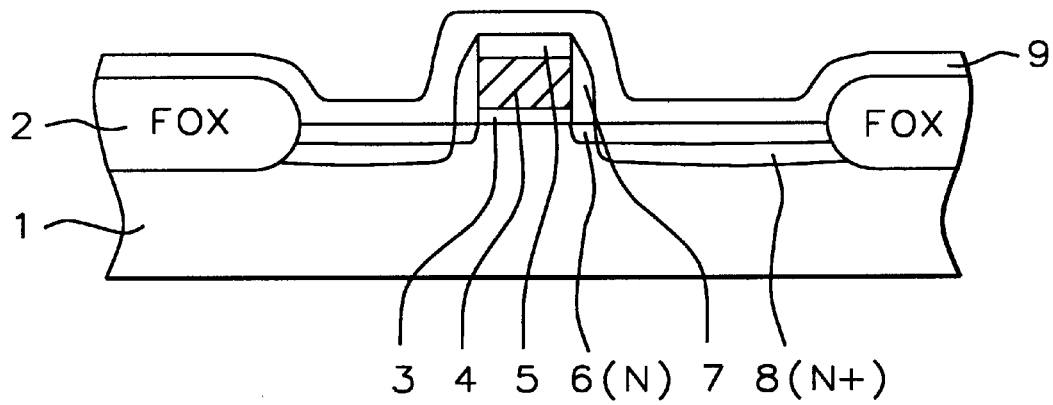

Referring to FIG. 1, a P type, semiconductor substrate, 1, with a <100>, single crystalline orientation, is used. Field oxide, (FOX), regions 2, are used for purposes of isolation. Briefly the FOX regions 2, are formed via thermal oxidation, in an oxygen-steam, or dry oxygen ambient, at a temperature between about 1000 to 1100° C., to a thickness between about 2000 to 4000 Angstroms. A patterned oxidation resistant mask of silicon nitride-silicon oxide is used to prevent FOX regions 2, from growing on areas of substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam, or dry oxygen ambient, at a temperature between about 800 to 900° C., to a thickness between about 50 to 200 Angstroms. A first polysilicon layer 4, is next deposited using low pressure chemical vapor deposition, (LPCVD), procedures, at a temperature between about 500 to 600° C., to a thickness between about 1500 to 2500 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. If a polycide gate structure is used a thinner layer of polysilicon, between about 500 to 1000 Angstroms, is used, and an overlying layer of a metal silicide, such as tungsten silicide, is deposited, using LPCVD procedures, to a thickness between about 1000 to 1500 Angstroms. A first silicon oxide layer 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures, using $CHF_3$ as an etchant for silicon oxide layer 5, and using $Cl_2$ as an etchant for polysilicon layer 4, are used to create polysilicon gate structure 4, with overlying cap insulator layer 5, shown schematically in FIG. 1. Photoresist removal is accomplished via plasma oxygen ashing and careful wet cleans.

A lightly doped source and drain region 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400 to 700° C., to a thickness between about 800 to 2000 Angstroms, followed by a RIE procedure, using $CHF_3$ as an etchant, creating insulator spacer 7, on the sidewalls of polysilicon gate structures 4. A heavily doped source and drain region 8, is then formed via ion implantation of arsenic, at an energy between about 30 to 100 KeV, at a dose between about 1E14 to 5E16 atoms/cm$^2$. A third layer of undoped silicon oxide 9, is next deposited using LPCVD or PECVD procedures, at a temperature between about 400 to 700° C., to a thickness between about 1000 to 1500 Angstroms. The result of these procedures are schematically shown in FIG. 1.

Figure 2:
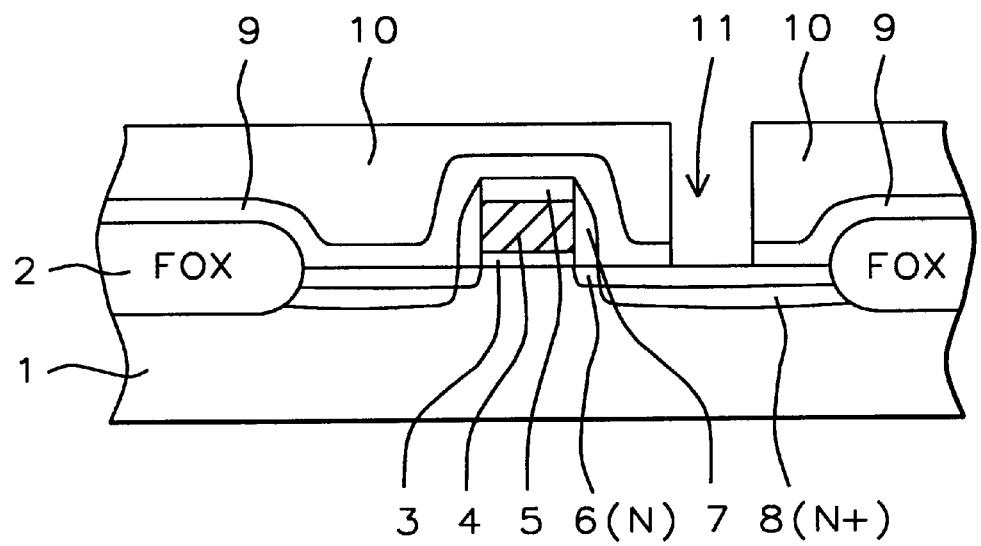

An interlevel insulator layer 10, comprised of either boro-phosphosilicate glass, (BPSG), or phosphosilicate glass, (PSG), is next deposited, using atmospheric pressure chemical vapor deposition, (APCVD), or sub-atmospheric chemical vapor deposition, (SACVD), procedures, at a temperature between about 450 to 550° C., to a thickness between about 6000 to 10000 Angstroms, using tetraethylorthosilicate, (TEOS) as a source with the addition of either diborane and phosphine, for the BPSG layer, or the addition of only phosphine, for the PSG layer. Interlevel insulator layer 10, is then planarized using chemical mechanical polishing, to provide a smoother surface for subsequent depositions and patterning procedures. Conventional photolithographic and RIE procedures, using $CHF_3$ as an etchant, are used to open storage node contact hole 11, in interlevel insulator layer 10, and in silicon oxide layer 9, exposing the top surface of heavily doped source and drain region 8. Photoresist removal is performed via use of plasma oxygen ashing and careful wet cleans. The result of these procedures are schematically shown in FIG. 2.

FIGS. 3–5, schematically describe prior art, in which HSG polysilicon sidewalls are used to increase the surface area of a storage node structure. In the prior art, the removal of unwanted HSG polysilicon, results in the degradation of the top surface of a polysilicon storage node structure. This unwanted phenomena will be addressed by process solutions offered in this invention. Referring to FIG. 3, a layer of polysilicon layer is next deposited, via LPCVD procedures, at a temperature between about 500 to 600° C., to a thickness between about 4000 to 10000 Angstroms, completely filling storage node contact hole 11. The polysilicon layer can be deposited intrinsically and doped via ion implantation of either phosphorous or arsenic, or the polysilicon layer, can be deposited using in situ doping procedures, via the addition of either phosphine or arsine, to a silane ambient. A photoresist shape 13, is than formed on the second polysilicon layer, and used as a mask to allow a RIE procedure, using $Cl_2$ as an etchant, to pattern the polysilicon layer, creating polysilicon shape 12.

After removal of photoresist shape 13, via plasma oxygen ashing and careful wet cleans, an HSG polysilicon layer 14a, is deposited using LPCVD procedures, at a temperature between about 500 to 600° C., to a thickness between about 300 to 700 Angstroms. This prior art is schematically shown in FIG. 4. HSG polysilicon layer 14a, comprised of a roughened topography, offers greater surface area than counterparts fabricated with smooth polysilicon surfaces. The next procedure is the removal of unwanted portions of HSG polysilicon layer 14a, from regions between storage node structures, thus creating a storage node structure comprised of HSG polysilicon sidewalls 14b, on the sides of polysilicon shape 12. This is schematically shown for prior art, in FIG. 5. However the removal of unwanted portions of HSG polysilicon layer 14a, is performed via a RIE procedure, using $Cl_2$ as an etchant. This procedure results in the transfer of the roughened topography of HSG polysilicon layer 14a, to the top surface of polysilicon shape 12, resulting in a roughened, top surface topography 15. The roughened topography of HSG polysilicon layer 14a, is not transferred to underlying interlevel insulator layer 10, due to the $Cl_2$ etchant not attacking insulator material. The roughened, top surface topography, for polysilicon shape 12, can create a problem for the formation of an overlying capacitor dielectric layer. The sharp corners of a overlying, thin capacitor dielectric layer, can result in a higher than expected leakage, and lower than expected breakdown voltage, thus deleteriously influencing the DRAM device.

Figure 7:
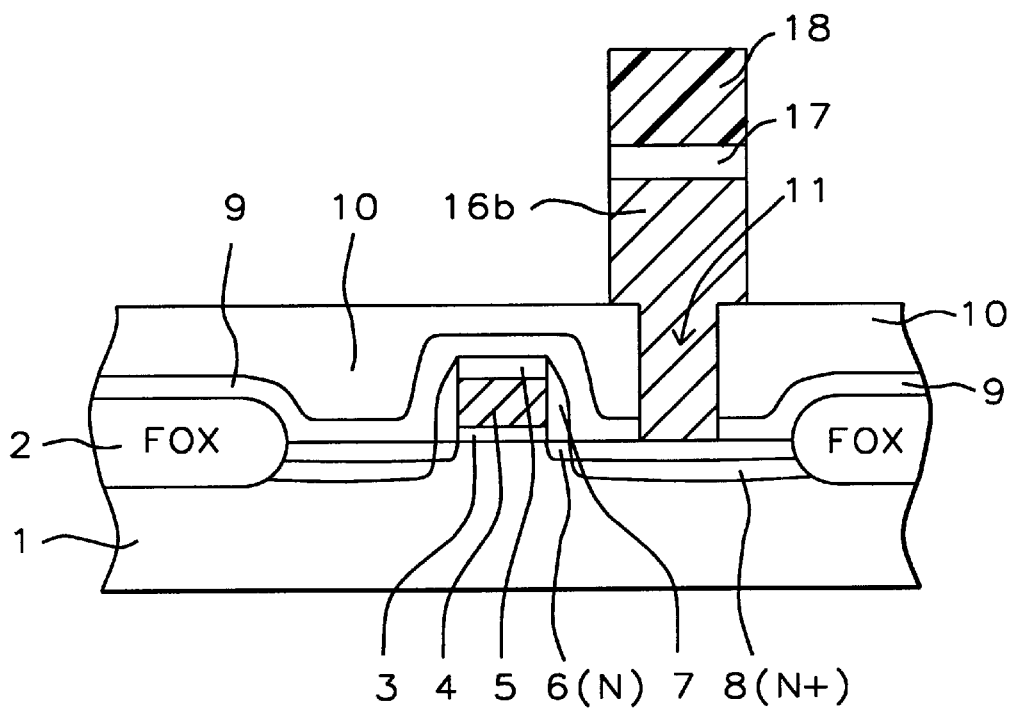

Solution to the unwanted, roughened, top surface topography of a storage node structure will now be described. A first solution for this phenomena is schematically described using FIGS. 6–10. A second polysilicon layer 16a, is deposited, using LPCVD procedures, at a temperature between about 500 to 600° C., to a thickness between about 4000 to 10000 Angstroms, and doped using procedures identical to the procedures used for the polysilicon shape 12, described in the prior art. A critical insulator layer 17, of silicon oxide, is next deposited on the top surface of second polysilicon layer 16a, using LPCVD or PECVD procedures, at a temperature between about 400 to 700° C., to a thickness between about 300 to 1000 Angstroms. Insulator layer 17 can also be a silicon nitride, or a silicon oxynitride layer. This is schematically shown in FIG. 6. Photoresist shape 18, is next used as a mask to allow patterning of second polysilicon layer 16a, to be performed. A RIE procedure, first using $CHF_3$ as an etchant for insulator layer 17, and than using $Cl_2$ as an etchant for second polysilicon layer 16a, results in the formation of polysilicon shape 16b, capped with insulator layer 17. This is schematically shown in FIG. 7.

Figure 8:
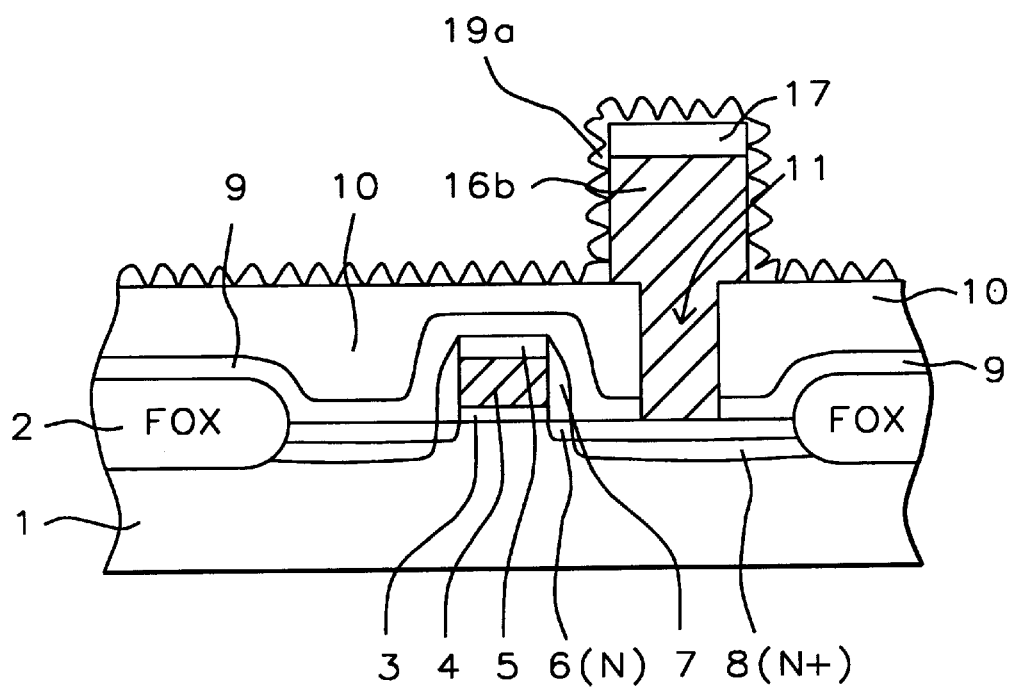
Figure 9:
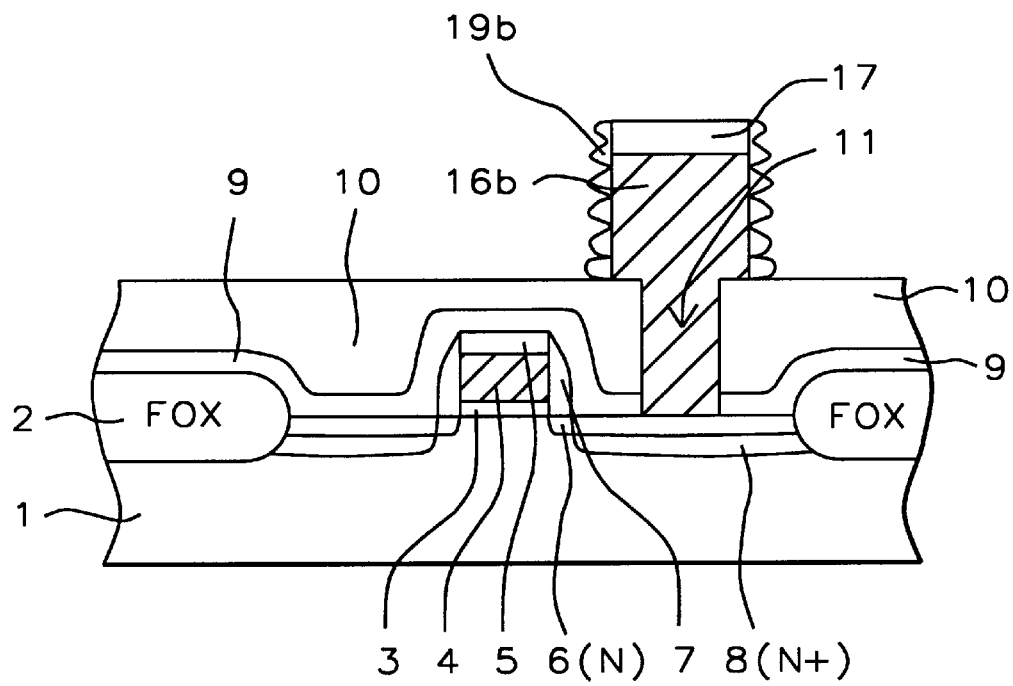
Figure 10:
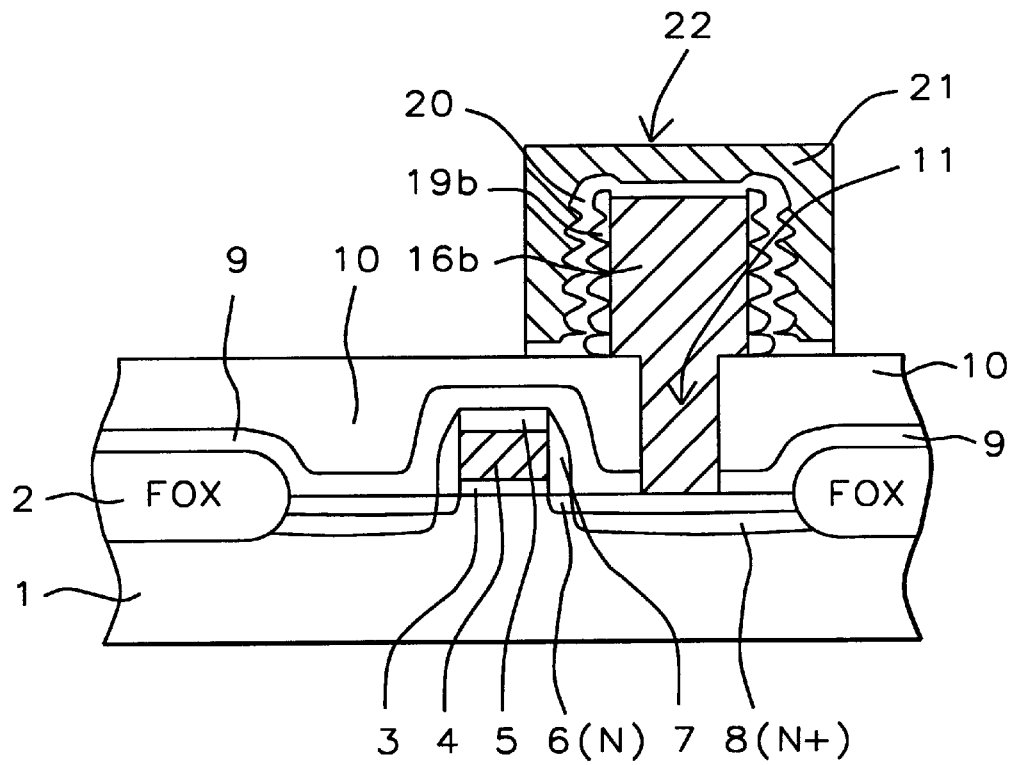

After removal of photoresist shape 18, via plasma oxygen ashing and careful wet cleans, HSG polysilicon layer 19a, is deposited, using LPCVD procedures, at a temperature between about 500 to 600° C., to a thickness between about 300 to 700 Angstroms. HSG polysilicon layer 19a, again exhibits a roughened topography. This is schematically shown in FIG. 8. The removal of unwanted portions of HSG polysilicon layer 19a, is next addressed via a RIE procedure, using $Cl_2$ as an etchant, creating HSG polysilicon sidewalls 19b, on the sides of polysilicon shape 16b. However the use of the capping, insulator layer 17, protected the top surface of polysilicon shape 16b, from attack during the formation of the HSG polysilicon sidewalls, in the selective RIE, $Cl_2$ ambient. The storage node structure comprised of HSG polysilicon sidewalls 19b, on polysilicon shape 16b, and with the smooth top surface of polysilicon shape 16b, capped with insulator layer 17, is schematically shown in FIG. 9.

Removal of the capping, insulator layer 17, via a RIE procedure, using $CHF_3$ and $CF_4$, as etchants, (interlevel insulator layer 10, will only be thinned by about 1000 Angstroms during this procedure), is followed by formation of capacitor dielectric layer 20, on the underlying storage node structure comprised of polysilicon shape 16b, with a smooth top surface topography, and the HSG polysilicon sidewalls 19b. Capacitor dielectric layer 20, can be an insulator layer possessing a high dielectric constant, such as $Ta_2O_5$, obtained via r.f sputtering techniques, at a thickness between about 50 to 200 Angstroms. Capacitor dielectric layer 20, can also be ONO, (Oxidized-silicon Nitride-silicon Oxide). The ONO layer is formed by initially growing a silicon dioxide layer, between about 10 to 20 Angstroms, followed by the deposition of a silicon nitride layer, between about 40 to 60 Angstroms. Subsequent thermal oxidation of the silicon nitride layer results in the formation of a silicon oxynitride layer on silicon oxide, at a silicon oxide equivalent thickness of between about 40 to 60 Angstroms. Finally another layer of polysilicon is deposited, via LPCVD procedures, at a temperature between about 500 to 600° C., to a thickness between about 1000 to 2000 Angstroms. Doping of this polysilicon layer is accomplished via an in situ doping deposition procedure, by the addition of phosphine, to the silane ambient. Photolithographic and RIE procedures, using $Cl_2$ as an etchant, are next employed to create polysilicon upper electrode, or plate electrode 21, shown schematically in FIG. 10. Photoresist is again removed via plasma oxygen ashing and careful wet cleans, resulting in STC structure 22, featuring increased surface area, resulting from the use of a polysilicon storage node structure, featuring HSG polysilicon sidewalls.

Figure 11:
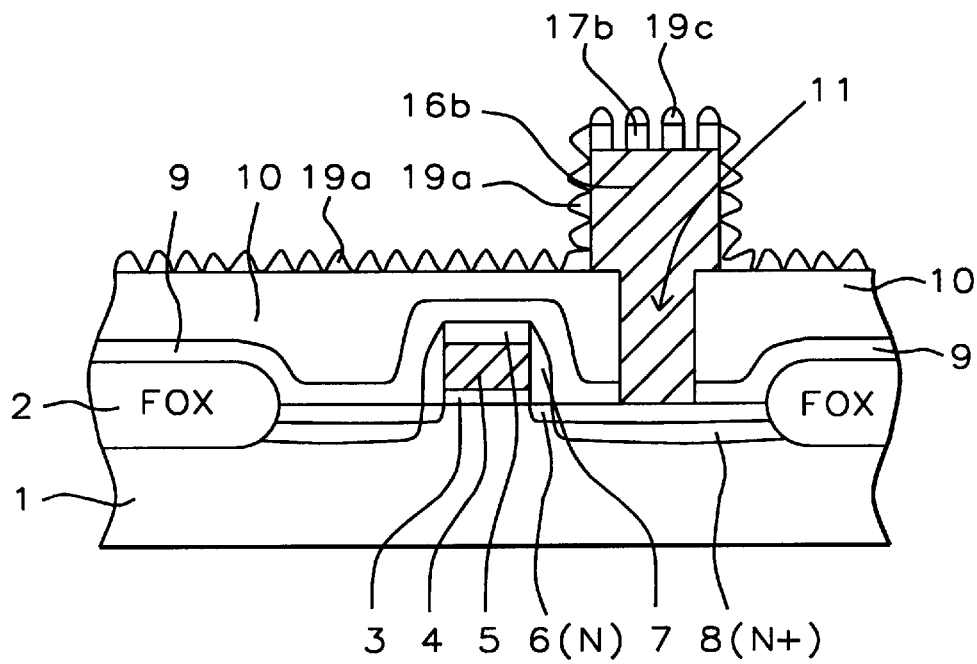
Figure 12:
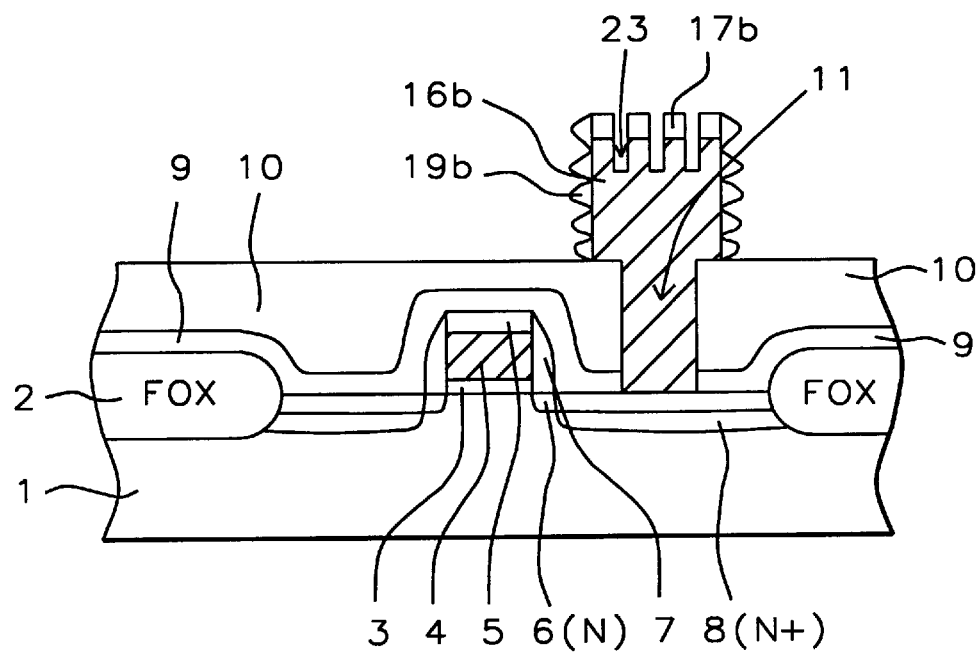
Figure 13:
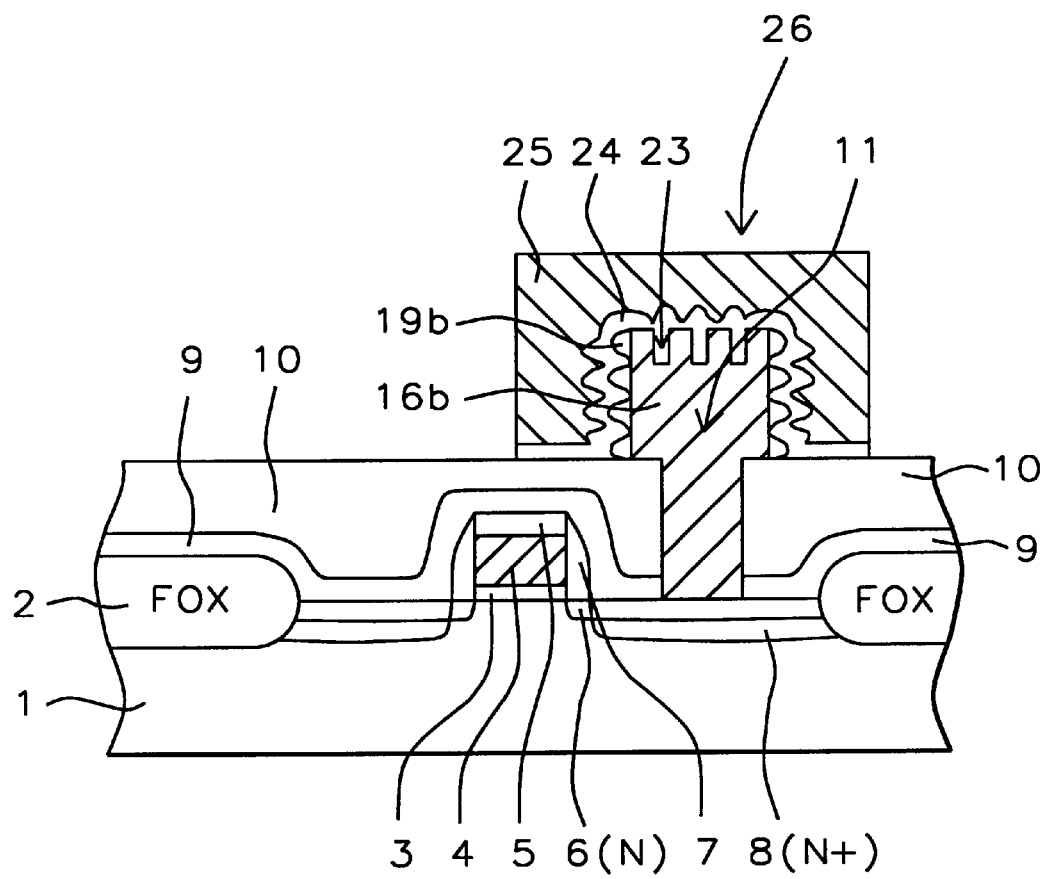

A second solution, used to avoid the roughened, top surface topography, of a storage node structure, is now described, and schematically illustrated using FIGS. 11–13. Referring to FIG. 8, in which HSG polysilicon layer 19a, has been deposited, and overlays capping insulator layer 17, a RIE procedure, selective to insulator removal, is performed.

This procedure, using $CHF_3$ as an etchant, attacks capping insulator 17, in regions exposed between the grains of HSG polysilicon layer 19a, forming capping insulator features 17b, underlying the now formed HSG polysilicon features 19c. This is schematically shown in FIG. 11. Although not shown in FIG. 11, the creation of these features can also be formed in interlevel insulator layer 10. Another RIE procedure, using $Cl_2$ as an etchant, is then used to form HSG polysilicon sidewalls 19b, on the sides of polysilicon shape 16b, as well as creating recesses 23, in the top surface of polysilicon shape 16b. This RIE procedure removes HSG polysilicon features 19c, from the top of capping insulator features 17b, which then allows capping insulator features 17b, to perform as the mask, during the $Cl_2$ RIE procedure, allowing the formation of recesses 23, to occur. This is schematically illustrated in FIG. 12.

The completion of the STC structure is next addressed via the removal of the capping insulator features 17b, again using a RIE procedure, using $CHF_3$ and $CF_4$, as etchants. A capacitor dielectric layer 24, is now formed on the underlying storage node structure, comprised of HSG polysilicon sidewalls 19b, on polysilicon shape 16b, and with polysilicon shape 16b, having a grated top surface featuring a pattern of recesses 23, resulting in additional surface area for the STC capacitor structure. The capacitor dielectric layer 24, can again be an ONO layer, identical to the ONO layer previously described in the first iteration of this invention. The creation of upper polysilicon electrode 25, obtained using the process previously described in the first iteration of this invention, completes the STC structure 26, schematically shown in FIG. 13, featuring the increased surface area, obtained via incorporation of a storage node structure featuring HSG polysilicon sidewalls, and a grated, top surface topography featuring a pattern of recesses.

The above preferred embodiment is described for a capacitor under bit line, (CUB), DRAM structure. However this invention can also be used for a capacitor over bit line, (COB), DRAM structure.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a stacked capacitor structure, for a DRAM device, on a semiconductor substrate, comprised of a polysilicon storage node structure, a dielectric layer, and an upper polysilicon electrode, with the storage node structure exhibiting a smooth top surface topography, and hemispherical grain, (HSG) polysilicon sidewalls, comprising the steps of:

providing a transfer gate transistor, on said semiconductor substrate, comprised of a polysilicon, or polycide gate structure, on a gate insulator layer, with source and drain regions in said semiconductor substrate;

forming a composite insulator layer on said transfer gate transistor;

planarizing said composite insulator layer;

opening a storage node contact hole, in said composite insulator, exposing the top surface of a source and drain region, of said underlying transfer gate transistor;

depositing a polysilicon layer on top surface of said composite insulator layer, completely filling said storage node contact hole;

depositing a capping insulator layer on said polysilicon layer;

patterning to create a polysilicon shape, comprised of the overlying capping insulator layer, contacting said source and drain region, in said storage node contact hole;

depositing an HSG polysilicon layer;

anisotropic etching to remove said HSG polysilicon layer from the top surface of said composite insulator layer, and from top surface of said capping insulator layer, creating said polysilicon storage node structure with HSG polysilicon sidewalls on said polysilicon shape, and with said capping insulator layer on said polysilicon shape;

removing said capping insulator layer from top surface of said polysilicon shape;

forming said dielectric layer on said polysilicon storage node electrode; and forming said upper polysilicon electrode structure, on said dielectric layer.

2. The method of claim 1, wherein said gate insulator layer, of said transfer gate transistor, is a silicon dioxide layer, thermally grown in an oxygen-steam, or dry oxygen ambient, at a temperature between about 800 to 900° C., to a thickness between about 50 to 200 Angstroms.

3. The method of claim 1, wherein said polysilicon layer, used for said polysilicon shape, is deposited using LPCVD procedures, at a temperature between about 500 to 600° C., to a thickness between about 4000 to 10000 Angstroms, and doped via an in situ doping deposition procedure, or via an ion implantation procedure using either arsenic or phosphorous.

4. The method of claim 1, wherein said capping insulator layer is silicon oxide, deposited using LPCVD or PECVD procedures, at a temperature between about 400 to 700° C., to a thickness between about 300 to 1000 Angstroms.

5. The method of claim 1, wherein said polysilicon shape is formed via a RIE procedure, using $CHF_3$ as an etchant for said capping insulator layer, and using $Cl_2$ as an etchant for said polysilicon layer.

6. The method of claim 1, wherein said HSG polysilicon layer is deposited, using LPCVD procedures, at a temperature between about 500 to 600° C., to a thickness between about 300 to 700 Angstroms.

7. The method of claim 1, wherein said HSG polysilicon sidewalls are formed on the sides of said polysilicon shape, via an anisotropic RIE procedure, using $Cl_2$ as an etchant, removing said HSG polysilicon layer from the top surface of said capping insulator layer.

8. The method of claim 1, wherein said dielectric layer is ONO, at an equivalent silicon dioxide thickness between about 40 to 80 Angstroms, created by an initial oxidation to form a silicon oxide layer, between about 10 to 20 Angstroms, followed by a deposition of silicon nitride, to a thickness between about 40 to 60 Angstroms, and thermal oxidation of said silicon nitride layer, creating a silicon oxynitride layer, on the underlying, said silicon oxide layer.

9. The method of claim 1, wherein said upper polysilicon electrode structure is formed via a $Cl_2$ a RIE procedure, applied to a polysilicon layer, with a thickness between about 1000 to 2000 Angstroms.

10. A method of fabricating a storage node structure, for a stacked capacitor structure, (STC), on a semiconductor substrate, in which the surface area of the storage node structure is increased via use of a grated top surface topography, and via use of hemispherical grain, (HSG), polysilicon sidewalls, comprising the steps of:

providing a transfer gate transistor on said semiconductor substrate, comprised of a polysilicon, or polycide gate structure, on an underlying gate insulator layer, and with source and drain regions in said semiconductor substrate;

depositing a composite insulator layer on said transfer gate transistor;

planarizing said composite insulator layer;

opening a storage node contact hole in said composite insulator layer, exposing the top surface of a source and drain region, of said transfer gate transistor;

depositing a first polysilicon layer on top surface of said composite insulator layer, completely filling said storage node contact hole;

depositing a capping insulator layer on said first polysilicon layer;

patterning of said capping insulator layer, and of said first polysilicon layer, to create a polysilicon shape, on said composite insulator layer, and contacting said source and drain region, in said storage node contact hole;

depositing an HSG polysilicon layer, comprised of HSG polysilicon lumps, and spaces between HSG polysilicon lumps;

a first RIE procedure removing said capping insulator layer, in regions in which said capping insulator layer is exposed in spaces between said HSG polysilicon lumps, creating HSG polysilicon-capping insulator columns, on the top surface of said polysilicon shape;

a second RIE procedure removing said HSG polysilicon layer from the top surface of said composite insulator layer, creating said HSG polysilicon sidewalls, on the sides of said polysilicon shape, while removing HSG polysilicon lumps, from said HSG polysilicon-capping insulator columns, and removing said first polysilicon layer, in regions in which said first polysilicon layer is not covered by said HSG polysilicon-capping insulator columns, creating a grated topography in the top surface of said polysilicon shape;

removing said capping insulator from the top surface of said first polysilicon layer, of said polysilicon shape, resulting in said storage node structure comprised of a grated top surface topography, in said polysilicon shape, and said HSG polysilicon sidewalls, on said polysilicon shape;

forming a capacitor dielectric layer on said storage node electrode;

depositing a second polysilicon layer on said capacitor dielectric layer; and patterning of said second polysilicon layer to form an upper polysilicon electrode structure, for said STC structure.

11. The method of claim 10, wherein said gate insulator layer, of said transfer gate transistor, is a silicon dioxide layer, thermally grown in an oxygen-steam, or dry oxygen ambient, at a temperature between about 800 to 900°, to a thickness between about 50 to 200 Angstroms.

12. The method of claim 10, wherein said first polysilicon layer is obtained via LPCVD procedures, at a temperature between about 500 to 600° C., to a thickness between about 4000 to 10000 Angstroms, with said first polysilicon layer doped using a deposition procedure incorporating an in situ doping procedure, or doped via ion implantation procedures.

13. The method of claim 10, wherein said capping insulator layer is silicon oxide, deposited using LPCVD or PECVD procedures, at a temperature between about 400 to 700° C., to a thickness between about 300 to 1000 Angstroms.

14. The method of claim 10, wherein said polysilicon shape is formed via RIE procedures, using $CHF_3$ as an etchant for said capping insulator layer, and using $Cl_2$ as an etchant for said first polysilicon layer.

15. The method of claim 10, wherein said HSG polysilicon layer is deposited using LPCVD procedures, at a temperature between about 500 to 600° C., to a thickness between about 300 to 700 Angstroms.

16. The method of claim 10, wherein said first RIE procedure, used to remove said capping insulator layer, in spaces between said HSG polysilicon lumps, is performed using $CHF_3$ as an etchant.

17. The method of claim 10, wherein said second RIE procedure, used to remove exposed regions of said HSG polysilicon layer, creating HSG polysilicon sidewalls, on the sides of said polysilicon shape, and creating crevices in the top surface of said first polysilicon layer, of said polysilicon shape, is performed using $Cl_2$ as an etchant.

18. The method of claim 10, wherein said capping insulator layer is removed via a RIE procedure, using $CHF_3$ and $CF_4$, as etchants.

19. The method of claim 10, wherein said capacitor dielectric layer is ONO, with an equivalent silicon oxide thickness between about 40 to 80 Angstroms, created by growing a thin silicon oxide layer on said storage node structure, at a thickness between about 10 to 20 Angstroms, depositing between about 40 to 60 Angstroms of a silicon nitride layer, and oxidizing said silicon nitride layer to from a silicon oxynitride layer on said thin silicon oxide layer.

20. The method of claim 10, wherein said second polysilicon layer is deposited using LPCVD procedures, at a temperature between about 500 to 600° C., to a thickness between about 1000 to 2000 Angstroms.

21. The method of claim 10, wherein said upper polysilicon electrode structure is created via RIE of said second polysilicon layer, using $Cl_2$ as an etchant.

* * * * *